US006812737B2

United States Patent
Sueyoshi et al.

(10) Patent No.: US 6,812,737 B2
(45) Date of Patent: Nov. 2, 2004

(54) PROGRAMMABLE LOGIC CIRCUIT DEVICE HAVING LOOK UP TABLE ENABLING TO REDUCE IMPLEMENTATION AREA

(75) Inventors: Toshinori Sueyoshi, Kumamoto (JP); Masahiro Iida, Fujisawa (JP)

(73) Assignee: Semiconductor Technology Academic Research Center, Kanagawa (JP)

( * ) Notice: Subject to any disclaimer, the term of this patent is extended or adjusted under 35 U.S.C. 154(b) by 0 days.

(21) Appl. No.: 10/183,590

(22) Filed: Jun. 28, 2002

(65) Prior Publication Data

US 2003/0001615 A1 Jan. 2, 2003

(30) Foreign Application Priority Data

Jun. 29, 2001 (JP) ..................................... 2001-199644

(51) Int. Cl.[7] ............................................. H03K 19/173
(52) U.S. Cl. ............................. 326/38; 326/39; 326/40
(58) Field of Search ................................... 329/37–47

(56) References Cited

U.S. PATENT DOCUMENTS

| | | | |
|---|---|---|---|
| 4,706,216 A | 11/1987 | Carter | |
| 4,870,302 A | 9/1989 | Freeman | |
| 5,442,306 A | 8/1995 | Woo | |
| 5,778,439 A | 7/1998 | Trimberger et al. | |
| 5,905,385 A | 5/1999 | Sharpe-Geisler | |
| 5,909,126 A | * 6/1999 | Cliff et al. ................. | 326/41 |
| 5,999,015 A | * 12/1999 | Cliff et al. ................. | 326/39 |
| 6,323,677 B1 | * 11/2001 | Lane et al. ................. | 326/37 |
| 6,476,636 B1 | * 11/2002 | Lien et al. ................. | 326/41 |

FOREIGN PATENT DOCUMENTS

| | | |
|---|---|---|
| JP | 03-063846 | 3/1991 |
| JP | 08-237109 | 9/1996 |

OTHER PUBLICATIONS

Rose, Jonathoan, et al., "Architecture of Field–Programmable Gate Arrays: The Effect of Logic Block Functionality on Area Efficiency", IEEE J. Solid–State Circuits, vol. 25, No. 5, pp. 1217–1225, Oct. 1990.
Rose, Jonathan, et al., "The Effect of Logic Block Architecture on FPGA Performance", IEEE J. Solid–State Circuits, vol. 27, No. 3., pp. 281–287, Mar. 1992.
Ahmed, Elias et al., "The Effect of LUT and Cluster Size on Deep–Submicron FPGA Performance and Density", FPGA 2000, Monterey, CA USA, 2000.

* cited by examiner

Primary Examiner—Anh Q Tran
(74) Attorney, Agent, or Firm—Staas & Halsey LLP

(57) ABSTRACT

A programmable logic circuit device has a plurality of logic blocks, a plurality of routing wires, a plurality of switch circuits, a plurality of connection blocks, and an I/O block performing an input/output operation with external equipment. The routing wires are connected to each of the logic blocks, the switch circuits are provided at an intersection of each of the routing wires, and the connection blocks are provided between an I/O line of each of the logic blocks and each of the routing wires. Each of the logic blocks has a look up table of M inputs and N outputs, which has a plurality of LUT units; and an internal configuration control circuit controlling an internal configuration of the plurality of LUT units.

16 Claims, 14 Drawing Sheets

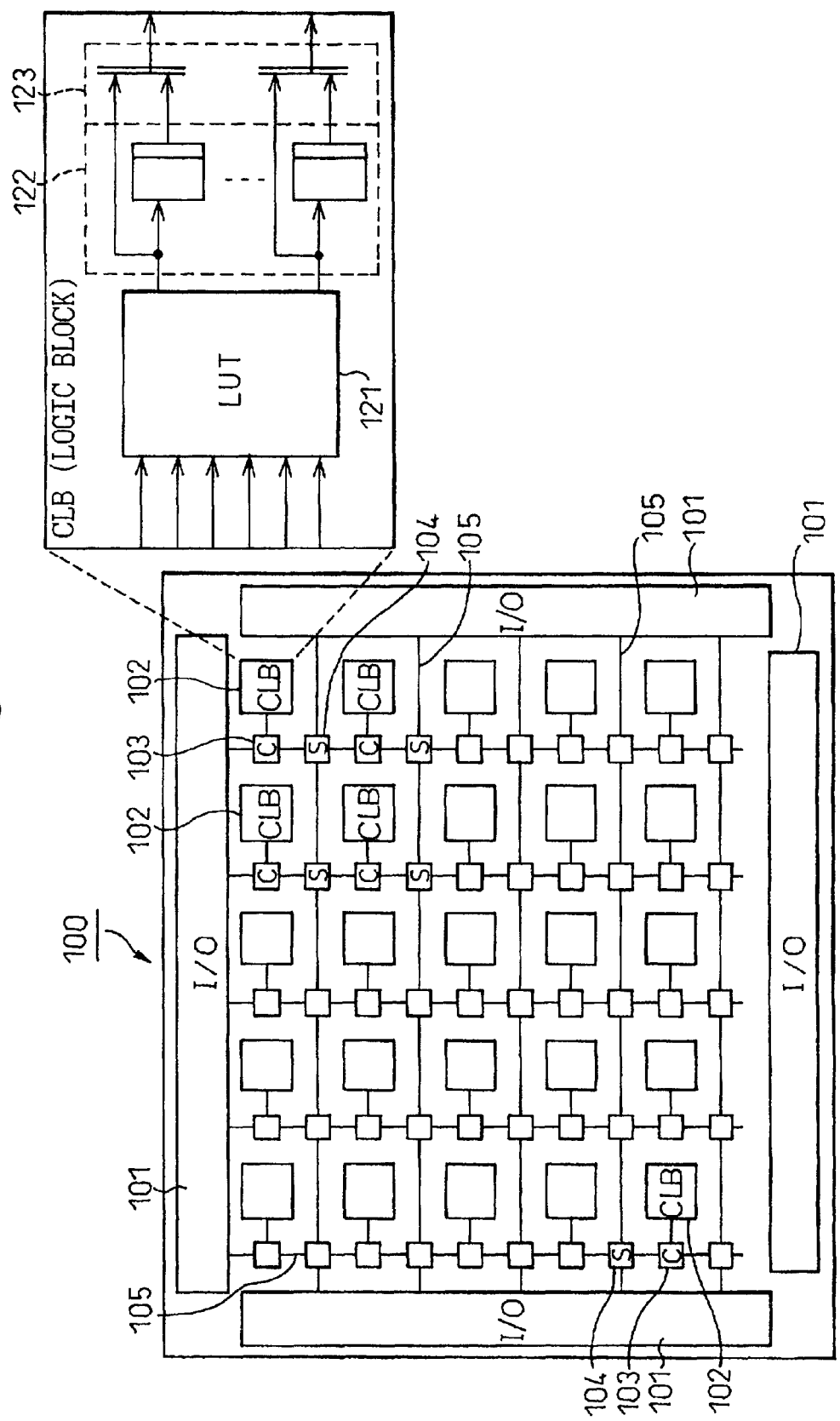

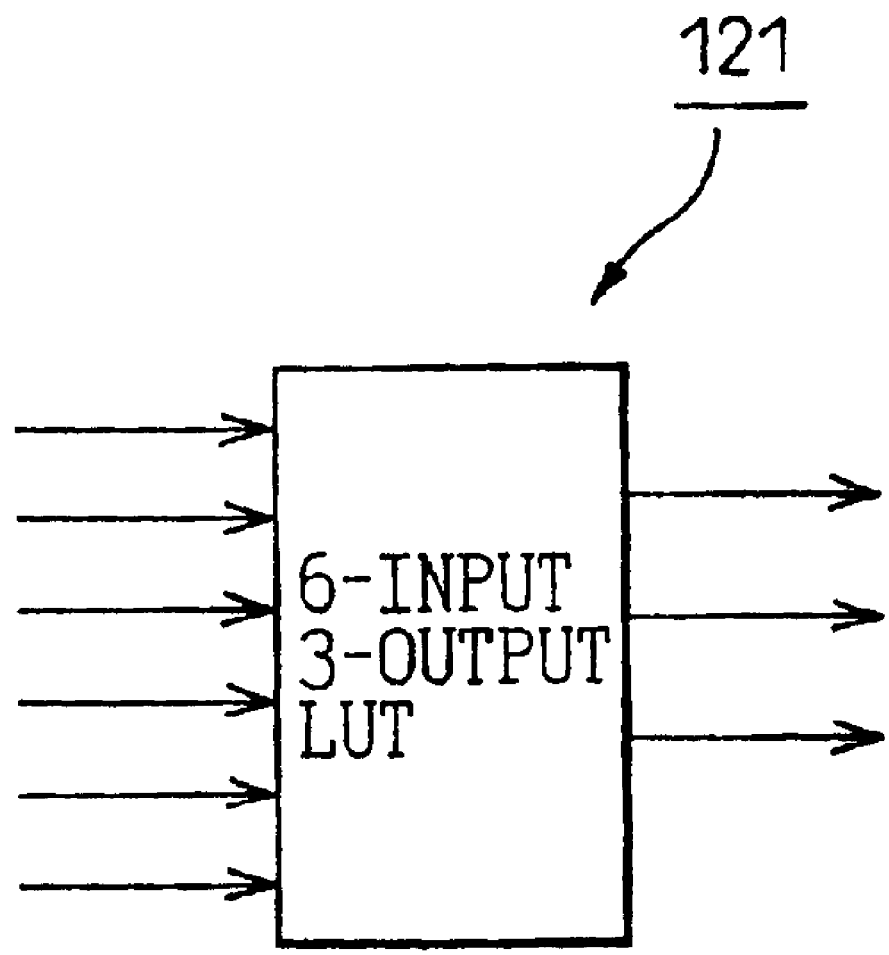

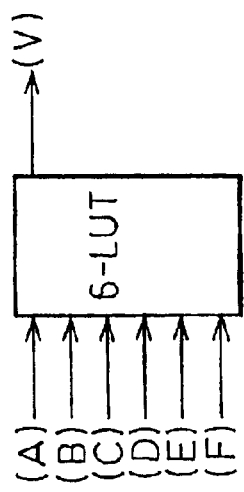
Fig.3C
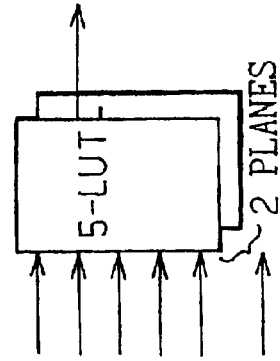
Fig.3F
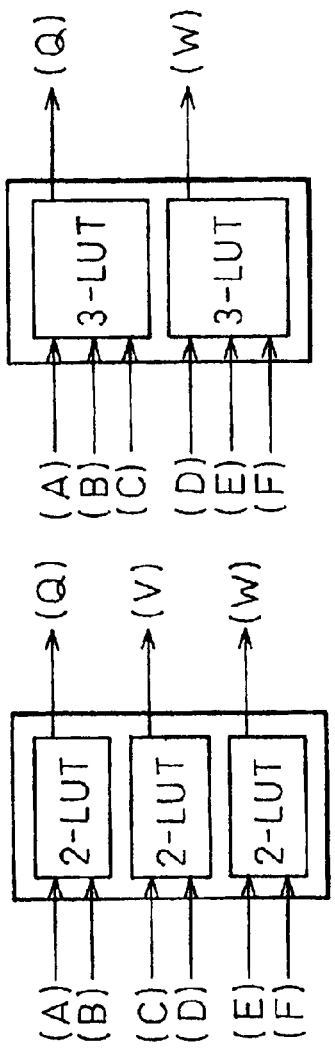
Fig.3B
Fig.3E
Fig.3A
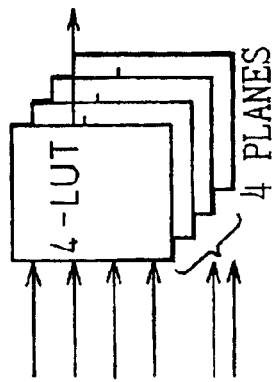
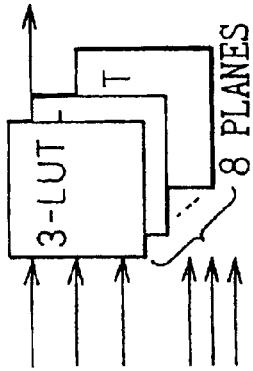
Fig.3D

PROGRAMMABLE LOGIC CIRCUIT DEVICE HAVING LOOK UP TABLE ENABLING TO REDUCE IMPLEMENTATION AREA

BACKGROUND OF THE INVENTION

1. Field of the Invention

The present invention relates to an architectural technology for configuring a look up table that enables implementation area to be reduced.

2. Description of the Related Art

Recently, a programmable logic circuit device has attracted much attention as a device that can realize various logic circuits which meets diverse needs of users by programming internal circuits. Such a programmable logic circuit device is known as PLD (Programmable Logic Device) or FPGA (Field Programmable Gate Array), and recently is increasingly used not only for trial fabrication of hardwares, but also for constructing a large scale circuit (for example, a microprocessor) that has various functions in itself. These programmable logic circuits comprise look up tables (LUT: Look Up Table) as major components, and reduction of circuit area of such LUTs is strongly desired.

A look up table (LUT) as a major component of a programmable logic circuit device (PLD or FPGA) is composed of memories, and is capable of implementing an arbitrary logic circuit. Basic architecture of such a FPGA has been previously disclosed, for example, in U.S. Pat. Nos. 4,706,216, and 4,870,302. Multi-context and cluster architecture of plural LUTs in FPGA has been disclosed, for example, in U.S. Pat. Nos. 5,778,439 and 5,905,385, etc. With regard to evaluation of LUT used in FPGA (for example, evaluation of functionality and area, as well as performance evaluation, and evaluation of cluster architecture), study results are found in, for example, J. Rose et al., "Architecture of Field Programmable Gate Arrays: The Effect of Logic Block Functionality on Area Efficiency", IEEE J. Solid State Circuits, vol. 25, no. 5, pp. 1217–1225, October 1990, J. Rose et al., "The Effect of Logic Block Architecture on FPGA Performance", IEEE J. Solid State Circuits, vol. 27, no. 3, pp. 281–287, March 1992, and E. Ahmed et al., "The Effect of LUT and Cluster Size on Deep Sub-micron FPGA Performance and Density", FPGA 2000, Monterey, Calif. USA, 2000.

In a programmable logic circuit device, the number of bits M of input signal for the logic circuit that can be implemented corresponds to the number of bits of the address of memory composing the LUT, and the number of bits N of output signal corresponds to the number of output bits of the memory. Thus, a logic circuit that can be implemented in one LUT is an arbitrary logic circuit of M inputs and N outputs. Such a LUT is denoted in the present specification as M-input N-output LUT.

Conventionally, in FPGA for example, the input number M and output number N are both fixed value. Any logic circuit is divided in circuit unit of M inputs and N outputs, and is implemented using plural LUTs.

Therefore, in a conventional FPGA, even if circuit division results in a circuit having input bit number less than M, one LUT needs to be assigned to this circuit, leading to unnecessary increase of implementation area (logic and routing circuitry area; circuit area).

SUMMARY OF THE INVENTION

An object of the present invention is to reduce the circuit area of a look up table (LUT) and hence of a programmable logic circuit device. Another object of the present invention is to reduce power consumption of a programmable logic circuit device.

According to the present invention, there is provided a look up table of M inputs and N outputs, comprising a plurality of LUT units; and an internal configuration control circuit controlling an internal configuration of the plurality of LUT units.

Further, according to the present invention, there is provided a programmable logic circuit device comprising a plurality of logic blocks; a plurality of routing wires connected to each of the logic blocks; a plurality of switch circuits provided at an intersection of each of the routing wires; a plurality of connection blocks provided between an I/O line of each of the logic blocks and each of the routing wires; and an I/O block performing an input/output operation with external equipment, wherein each of the logic blocks has a look up table of M inputs and N outputs, comprising a plurality of LUT units; and an internal configuration control circuit controlling an internal configuration of the plurality of LUT units.

The internal configuration control circuit may comprise a plurality of selectors selecting I/O signals of the plurality of LUT units; and a selector control circuit controlling the selectors and defining the internal configuration of the plurality of LUT units. The selector control circuit may comprise a memory, and control the plurality of selectors in accordance with data stored in the memory.

The plurality of selectors may include an input signal selector provided at an input of at least one of the LUT units to select an input signal; and an output signal selector provided at an output of the LUT units selecting an output signal, the input signal selector and the output signal selector being controlled in accordance with the data stored in the memory. The plurality of selectors may include an input signal selector provided at an input of at least one of the LUT units to select an input signal; and an output signal selector provided at an output of the LUT units selecting an output signal, the input signal selector and the output signal selector being controlled in accordance with the input signal.

The look up table of M inputs and N outputs may be a 6-input 3-output look up table. The 6-input 3-output look up table may comprise eight 3-input 1-output LUT units. The 6-input 3-output look up table may comprise four 3-input 2-output LUT units.

In addition, according to the present invention, there is also provided a method of configuring a look up table of M inputs and N outputs, comprising the steps of providing a plurality of LUT units; and selectively controlling I/O signals of the plurality of LUT units to set a predetermined mode of an internal configuration.

The I/O signals of the plurality of LUT units may be selectively controlled in accordance with data stored in the corresponding look up table. An input signal input to at least one of the LUT units and an output signal output from the LUT unit may be selectively controlled in accordance with data stored in the corresponding look up table. An input signal input to at least one of the LUT units and an output signal output from the LUT unit may be selectively controlled in accordance with a predetermined function of the input signal.

BRIEF DESCRIPTION OF THE DRAWINGS

The present invention will be more clearly understood from the description of the preferred embodiments as set forth below with reference to the accompanying drawings, wherein:

FIG. 1 is a block diagram showing an example of FPGA to which the present invention is applied;

FIG. 2 is a block diagram showing a 6-input 3-output LUT as an example of LUTs in the FPGA;

FIGS. 3A, 3B, 3C, 3D, 3E, and 3F are block diagrams showing the mode of internal configuration of the 6-input 3-output LUT shown in FIG. 2;

DESCRIPTION OF THE PREFERRED EMBODIMENTS

Figure 4:
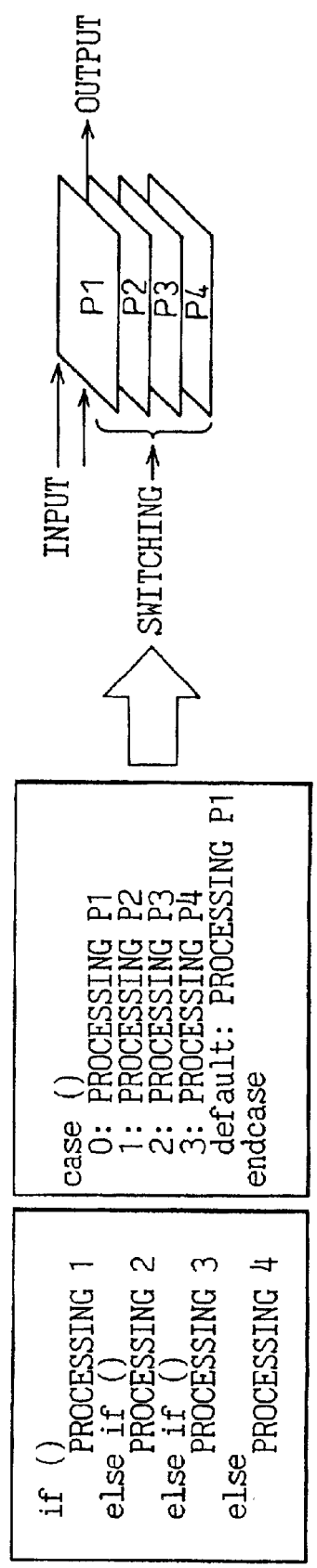
FIG. 4 is a view useful for explaining an example of the method of mapping circuits in a look up table.

Now, a look up table, a programmable logic circuit device comprising a look up table and a method for configuring a look up table according to the present invention will be described in detail below with reference to appended drawings.

FIG. 1 is a block diagram showing an example of FPGA to which the present invention is applied. In FIG. 1, reference numeral 100 denotes FPGA as an example of a programmable logic circuit device, 101 is an I/O block, 102 is a logic block (CLB: Configurable Logic Block), 103 is a connection block (C), 104 is a switch matrix (S), and 105 denotes routing wires.

As shown in FIG. 1, FPGA 100 is comprised of logic blocks (CLB) 102 arranged in the form of array, routing wire (channel area) 105 surrounding these CLB 102, and I/O blocks 101. At the intersection of the routing wire 105, switch matrices (S) 104 are disposed for connecting these components, and connection block (C) 103 is disposed between the I/O line of each CLB 102 and the routing wire 105. Each CLB 102 is comprised of a look up table (LUT) 121, latches 122, and selectors 123. The present invention relates mainly to the configuration of LUT 121.

FIG. 2 is a block diagram showing a 6-input 3-output LUT as an example of a LUT in a FPGA. This is an example of a LUT 121 in FIG. 1. Thus, the LUT shown in FIG. 2 corresponds to the configuration of a case of M-input N-output LUT in which M=6, N=3. The case of M=6, N=3 is only an example, and value of M and N is not limited to this case, but may include various other values, and may include the case M=N, or M<N.

FIGS. 3A to 3F are block diagrams showing different modes of internal configuration of the 6-input 3-output LUT shown in FIG. 2, and showing that, as will be described in detail later, by varying the values (X, Y, Z) of mode changing memory (71), the 6-input 3-output LUT can be set to different internal configurations as shown in FIGS. 3A to 3F.

Specifically, FIG. 3A shows a case where the 6-input 3-output LUT is set to a mode of three 2-input 1-output LUT. In conventional FPGA (conventionally composed by using 4-input 1-output LUT as a unit), for example, three LUTs (4-input 1-output LUT) are required to assign three 2-input 1-output circuits to LUTs. In the configuration shown in FIG. 3A, only one 6-input 3-output LUT needs to be used for this purpose.

Area ratio of 4-input 1-output LUT to 6-input 3-output LUT including routing channel area is about 1:1.5. Therefore, as compared to the conventional configuration using three 4-input 1-output LUTs, the configuration shown in FIG. 3A can reduce the circuit area ratio to about (1×3):1.5, that is, to about 1:0.5. Thus, reduction of circuit area of maximum 50% can be achieved.

FIG. 3B shows a case where the LUT is set to a mode of two 3 input 1 output LUTs. In this case, as compared to the conventional configuration where two 4-input 1-output LUTs are used, the circuit area ratio can be reduced to (1×2):1.5, that is, 1:0.75. Thus, reduction of circuit area of maximum 25% can be achieved.

Further, FIG. 3C shows a case where the 6-input 3-output LUT is set to a mode of 6-input 1-output LUT.

FIG. 3D shows a case where the 6-input 3-output LUT is set to a mode of 3-input 1-output LUT×8 planes.

FIG. 3E shows a case where the 6-input 3-output LUT is set to a mode of 4-input 1-output LUT×4 planes, and FIG. 3F shows a case where the 6-input 3-output LUT is set to a mode of 5-input 1-output LUT×2 planes.

FIG. 4 is a view useful for explaining the mapping method of circuits in the look up table, which shows the reason why mode setting of FIGS. 3D to 3F above is possible.

As shown in FIG. 4, in the mapping method which utilizes, for example, the control structure of if ~, else, case, etc., in RTL (Register Transfer Level) description of HDL (Hardware Description Language), since it is guaranteed that conditional branching is not explicitly simultaneous operation, processing within each condition is mapped to each context. Switching between contexts is performed, for example, by a signal from a control circuit implemented in other LUT (look up table).

In such a case, as shown in above described FIGS. 3D to 3F, plural LUTs can be configured with one LUT. Specifically, in the case shown in FIG. 3D, eight 3-input 1-output LUTs can be configured with one LUT (in FIG. 3D, one 6-input 3-output LUT). In the case shown in FIG. 3E, four 4-input 1-output LUTs can be configured with one LUT, and in the case shown in FIG. 3F, two 5-input 1-output LUTs can be configured with one LUT.

Specifically, in the configuration shown in FIG. 3E, for example, as compared to conventional configuration using four 4-input 1-output LUTs, the circuit area ratio can be reduced to about (1×4):1.5, that is, 1:0.375. Thus, reduction of implementation area (circuit area) of maximum about 62% can be achieved. In other words, the LUTs shown in FIG. 3E (LUTs configured with one 6-input 3-output LUT) can be configured in implementation area of about 32% of conventional LUTs (four 4-input 1-output LUTs), and can also substantially decrease the power consumption.

Also, if the case where an ALU circuit of 8 operations is implemented with conventional 4-input 1-output LUTs, is compared with the case where the 6-input 3-output LUT is used as 4-input 1-output LUT×4 planes for implementing same ALU circuit, circuit area can be reduced to about 75%, and achieve considerable improvement in packaging efficiency.

Figure 5:
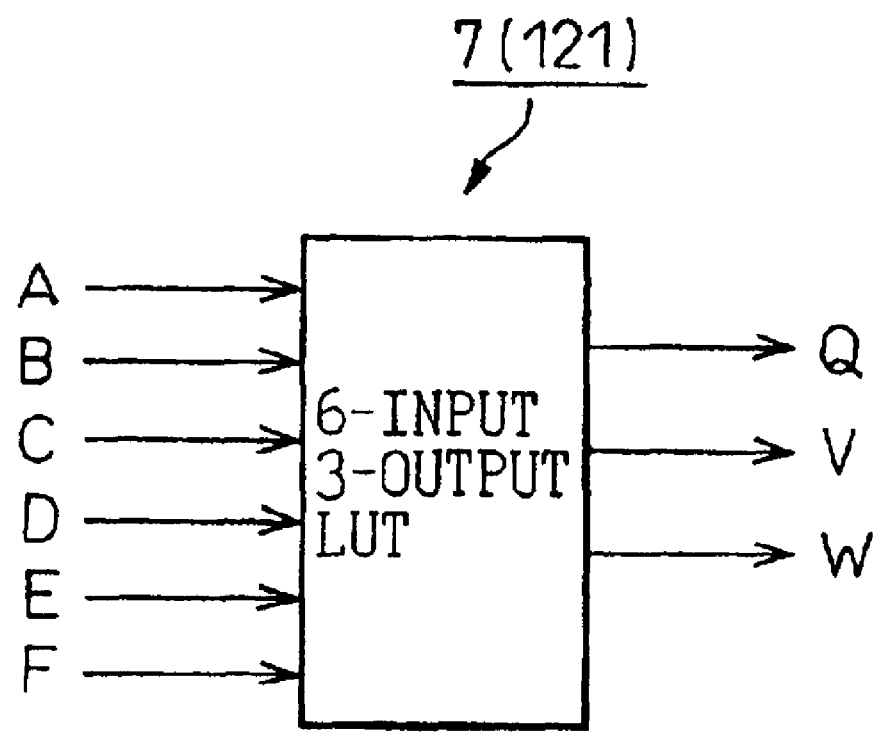
FIG. 5 is a block diagram showing a 6-input 3-output LUT as an example of a LUT in FPGA according to the present invention in conjunction with input/output signal.

FIG. 5 is a block diagram showing a 6-input 3-output LUT 7 as an example of LUT in FPGA according to the present invention in conjunction with the I/O signals. This corresponds to the 6-input 3-output LUT as shown in FIG. 2 with six input signals A, B, C, D, E, F and three output signals Q, V, W added thereto.

Figure 6:
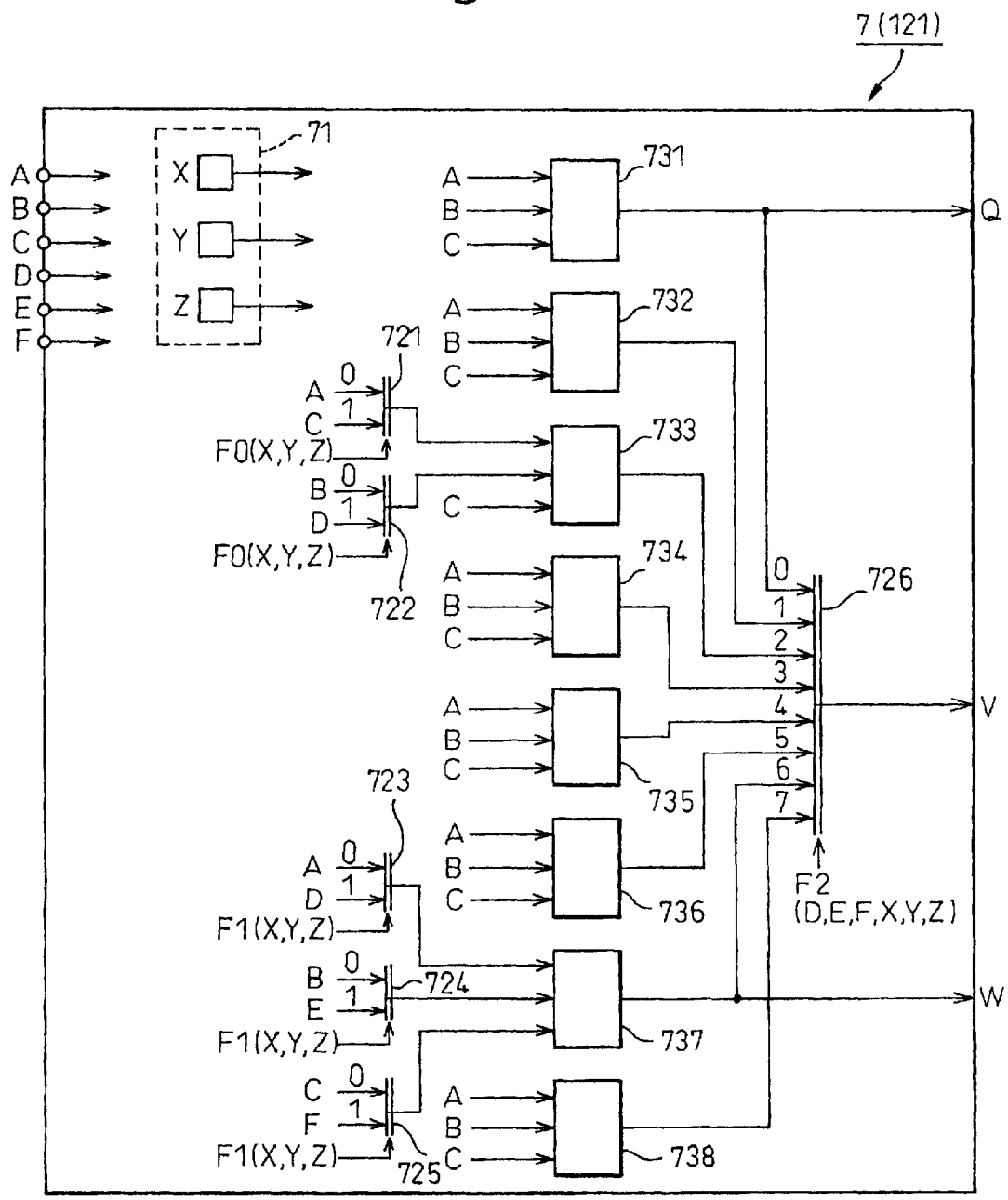
FIG. 6 is a block diagram showing an example of the internal configuration of the 6-input 3-output LUT shown in FIG. 5.

FIG. 6 is a block diagram showing an example of internal configuration of the 6-input 3-output LUT shown in FIG. 5.

As shown in FIG. 6, the 6-input 3-output LUT 7 (121) is comprised of a mode changing memory 71, selectors 721~726, and 3-input 1-output LUT units (memory array) 731~738. The mode changing memory 71 stores 3 bits data X, Y, Z designated by a user so as to set the relation between 6 bit input A~F and 3 bit output Q, V, W in accordance with user's request.

A predetermined signal within 6 bit input signal is input to each selector (selector for selecting input signal) 721~725, so as to select input signal in accordance with data stored in the mode changing memory 71. That is, signals A, C are input to the selector 721, and signals B, D are input to selector 722, and one of the signals is selected by selection signal F0 (X, Y, Z) specified by data X, Y, Z, and is output, respectively. Similarly, signals A, D are input to the selector 723, and signals B, E are input to the selector 724, and signals C, F are input to the selector 725, and one of the signals is selected by selection signal F1 (X, Y, Z) specified by data X, Y, Z, and is output, respectively.

Each of 3-input 1-output LUT units 731~738 is comprised of an address decoder, a memory and a selector, as described later, and outputs 1 bit signal in response to 3 bit input signal, respectively. Thus, signals A, B, C are input to each of LUT units 731, 732, 734~736 and 738, and one of the signals A or C and one of the signals B or D selected by selection signal F0, and the signal C is input to the LUT unit 733, and one of the signals A or D, and one of the signals B or E, and one of the signals C or F, selected by the selection signal F1 is input to the LUT unit 737. Output signals from the LUT units 731~738 are input to a selector (selector for selecting output signal) 726, and one of the signals is selected by selection signal F2 (D, E, F, X, Y, Z) specified by signals D, E, F and data X, Y, Z, and is output as signal V. The signal Q is the output signal from the LUT unit 731, and the signal W is the output signal from the LUT unit 737.

Figure 7:
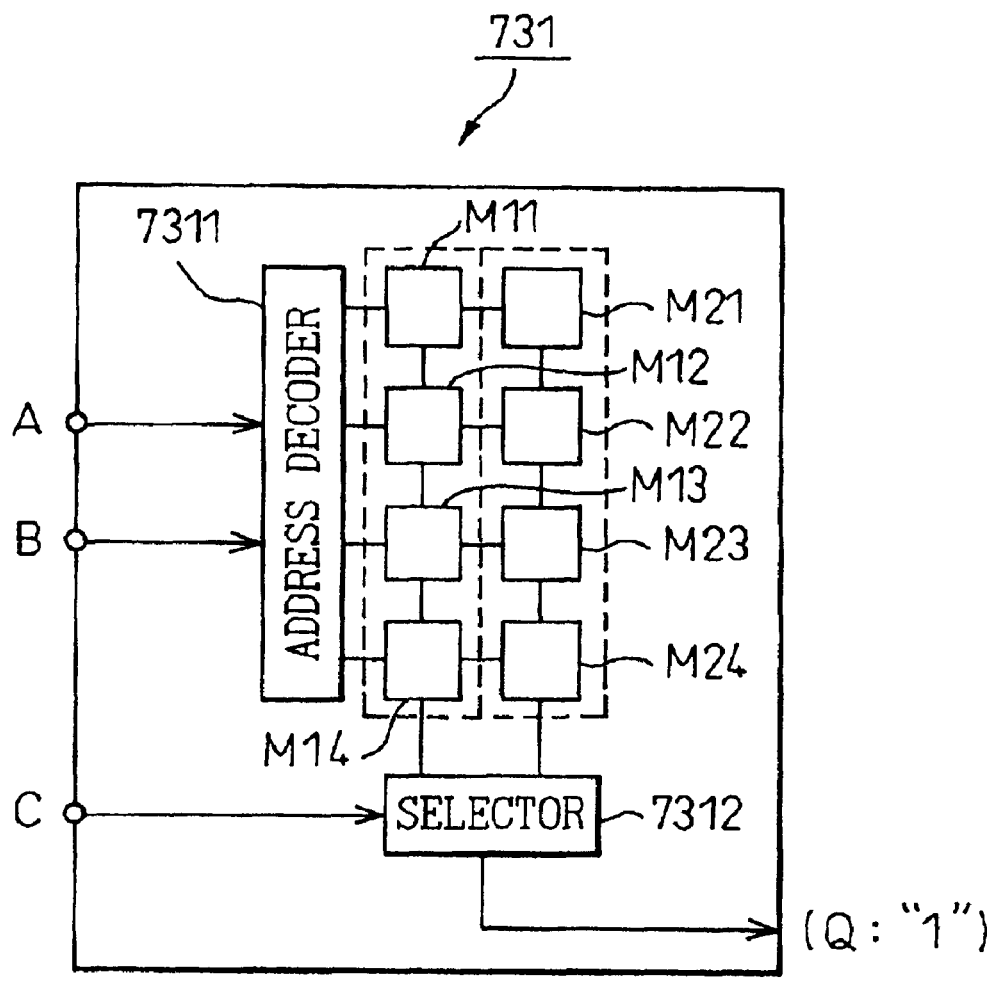
FIG. 7 is a block diagram showing an example of 3-input 1-output LUT unit in the 6-input 3-output LUT of FIG. 6.

FIG. 7 is a block diagram showing an example of 3-input 1-output LUT unit 731 in the 6-input 3-output LUT 7 of FIG. 6. All of the 3-input 1-output LUT units 731~738 are of similar configuration.

The LUT unit 731 shown in FIG. 7 is comprised of an address decoder 7311, a selector 7312, and two sets of 4 bit memory unit groups M11~M14, M21~M24. The address decoder 7311 decodes 2 bit input signal A, B to designate each one of the memory unit groups M1~M14 and M21~M24, and further according to the input signal C, selects one of the sets M11~M14 or M21~M24 to output data.

Figure 8:
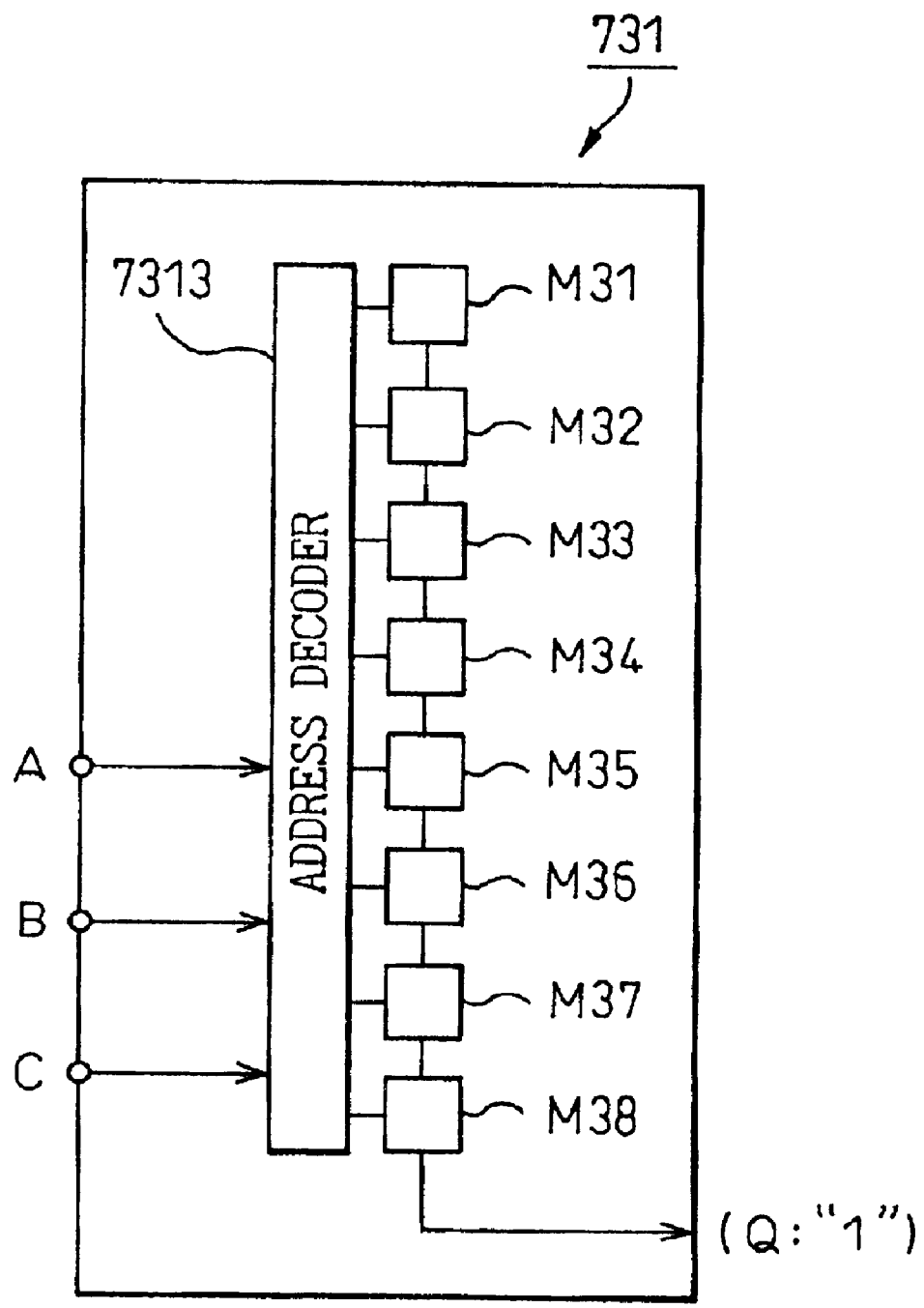
FIG. 8 is a block diagram showing another example of 3-input 1-output LUT unit in the 6-input 3-output LUT of FIG. 6.

FIG. 8 is a block diagram showing another example of 3-input 1-output LUT unit 731 in the 6-input 3-output LUT 7 of FIG. 6.

The LUT unit 731 shown in FIG. 8 is comprised of an address decoder 7313, and 8 bit memory unit groups M31~M38. The address decoder 7313 decodes the 3 bit input signals A, B, C, to designate one of the memory unit groups M31~M38, and output the data (Q).

The relation of the 3 bit data X, Y, Z, designated by the mode changing memory 71 in the 6-input 3-output LUT shown in FIG. 6 as described above and the corresponding internal configurations (configuration modes) will be explained below with reference to FIGS. 3A~3F.

First, when, as shown in FIG. 3A, the 6-input 3-output LUT 7 (121) is set to the mode of three 2-input 1-output LUTS, the selection signal F0 and F1 select an input "1" at each of the selectors 721, 722 and 723~725, and further, the selection signal F2 selects an input "2" at the selector 726.

That is, the user designates the 3 bit data X, Y, Z to be stored in the mode changing memory 71 such that the selection signal F0 (X, Y, Z) and F1 (X, Y, Z) selects an input "1" at each of the selectors 721, 722 and 723~725, and that the selection signal F2 (D, E, F, X, Y, Z) selects an input "2" at the selector 726.

Thus, by using the LUT unit 731 to which signals A, B, C are input and which outputs signal Q, the LUT unit 733 to which the signals C, D via the selectors 721, 722 and the direct signal C are input and which outputs the signal V via the selector 726, and the LUT unit 737 to which the signals D, E, F are input via the selectors 723 725 and which outputs the signal W, the three 2-input 1-output LUTs as shown in FIG. 3A can be configured. Although the input signal C in the LUT unit 731, one of the input signal C in the LUT unit 733, and the input signal D in the LUT unit 737 via the selector 723 are extra input signals in each of the LUT units, there is no problem about it.

Next, when, as shown in FIG. 3B, the 6-input 3-output LUT 7 is set to the mode of two 3-input 1-output LUTs, the 3 bit data X, Y, Z to be stored in the mode changing memory 71 is designated such that the selection signal F1 selects an input signal "1" at the selectors 723~725. By using the LUT unit 731 to which the signals A, B, C are input and which outputs the signal Q, and the LUT unit 737 to which the signals D, E, F are input via the selector 723~725 and which outputs the signal W, the two 3-input 1-output LUTs as shown in FIG. 3B can be configured.

When, as shown in FIG. 3C, the 6-input 3-output LUT is set to the mode of 6-input 1-output LUT, the selection signals F0 and F1 select an input "0" at each selector, and the selection signal F2 determines the value of the selector 726 from input signals D, E, F, and outputs the signal V. Thus, from 6 bit input of the signals A, B, C, and the signals D, E, F, 1 bit signal V is output.

As shown in FIG. 3D, when the 6-input 3-output LUT is set to the mode of 3-input 1-output LUT×8 planes, the selection signals F0 and F1 select an input "0" at each selector, and the selection signal F2 determines the value of the selector 726 from the signals D, E, F, and outputs the signal V. In this case, the signals D, E, F, use plane switching signals.

As shown in FIG. 3E, when the 6-input 3-output LUT is set to the mode of 4-input 1-output LUT×4 planes, the selection signals F0 and F1 select an input "0" at each selector, and the selection signal F2 determines the value of the selector 726 from the signals D, E, F, and outputs the signal V. In this case, the signal D is one of 4 bit input signals together with the signals A, B, C, and the signals E and F use plane switching signals.

As shown in FIG. 3F, when the 6-input 3-output LUT is set to the mode of 5-input 1-output LUT×2 planes, the selection signals F0 and F1 select an input "0" at each selector, and the selection signal F2 determines the value of the selector 726 from the signals D, E, F, and outputs the signal V. In this case, the signal D and E are two of 5 bit input signals together with the signals A, B, C, and the signals F uses a plane switching signal.

As has been described above, according to the present embodiment, the 6-input 3-output LUT, for example, may be used in various modes of internal configuration by varying the values X, Y, Z of the mode changing memory.

Figure 9:
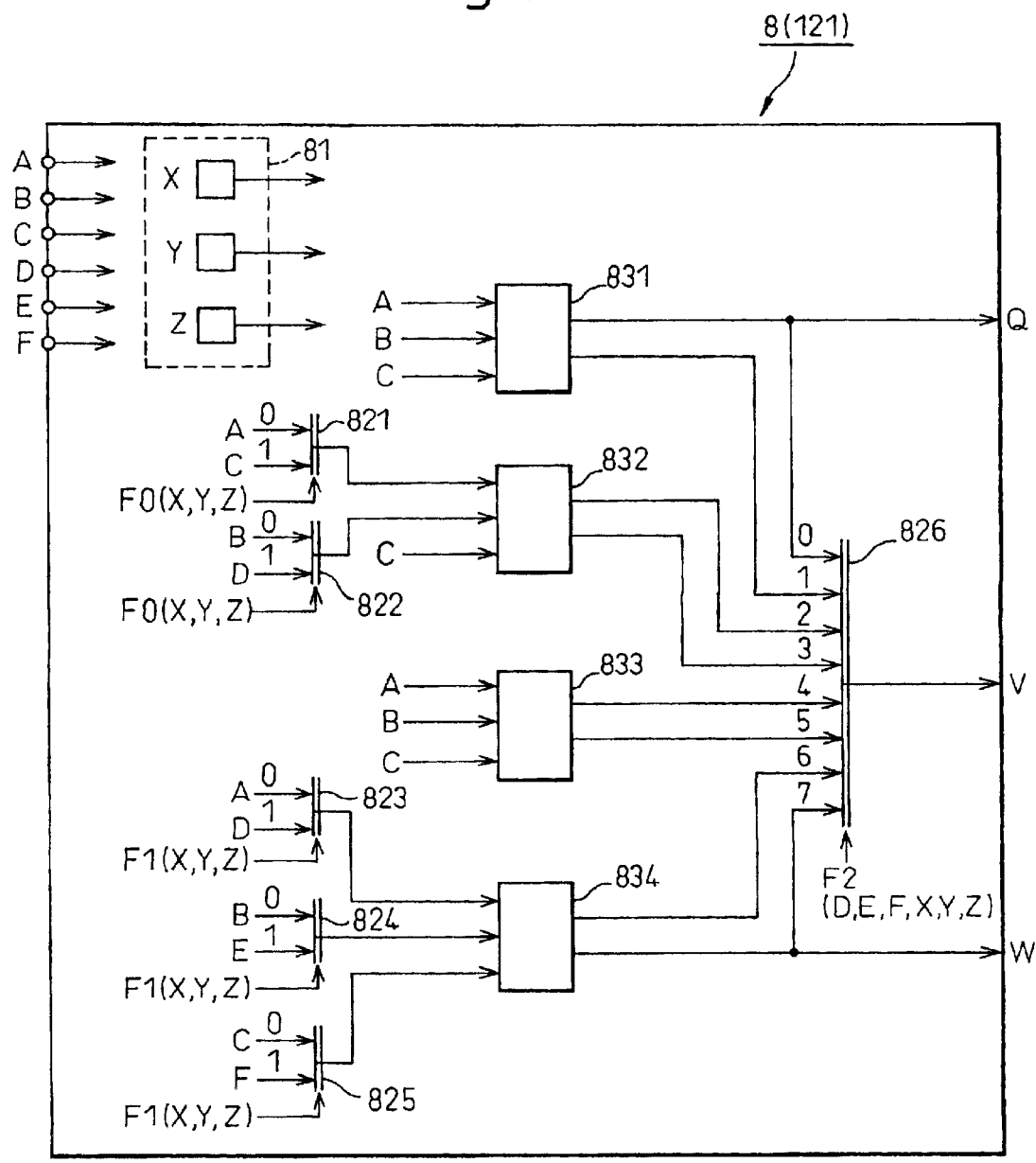
FIG. 9 is a block diagram showing another example of the internal configuration of the 6-input 3-output LUT shown in FIG. 5.

FIG. 9 is a block diagram showing another example of internal configuration, which is different from the above described internal configuration of 6-input 3-output LUT shown in FIG. 6.

As shown in FIG. 9, the 6-input 3-output LUT 8 (121) is comprised of a mode changing memory 81, selectors 821~826, and 3-input 2-output LUT units 831~834. The mode changing memory 81 stores 3 bit data X, Y, Z, designated by a user, so as to set the relation between 6 bit input A~F and 3 bit output Q, V, W in accordance with user's request.

Thus, in contrast to the above described 6-input 3-output LUT 7 shown in FIG. 6, which comprises eight 3-input 1-output LUT units 731~738, the present 6-input 3-output LUT 8 comprises four 3-input 2-output LUT units 831~834, and except for this, has substantially the same configuration. 3 bit data X, Y, Z, designated to the mode changing memory 81 of the LUT 8 shown in FIG. 9, selection signals F0 (X, Y, Z), F1 (X, Y, Z), and F2 (D, E, F, X, Y, Z), as well as the operation of selectors 821~826 (corresponding to the selectors 721~726) controlled by these selection signals F0, F1, F2, are the same as has been described with reference to FIG. 6 and FIGS. 3A~3F, and explanation thereof is therefore omitted.

Figure 10:
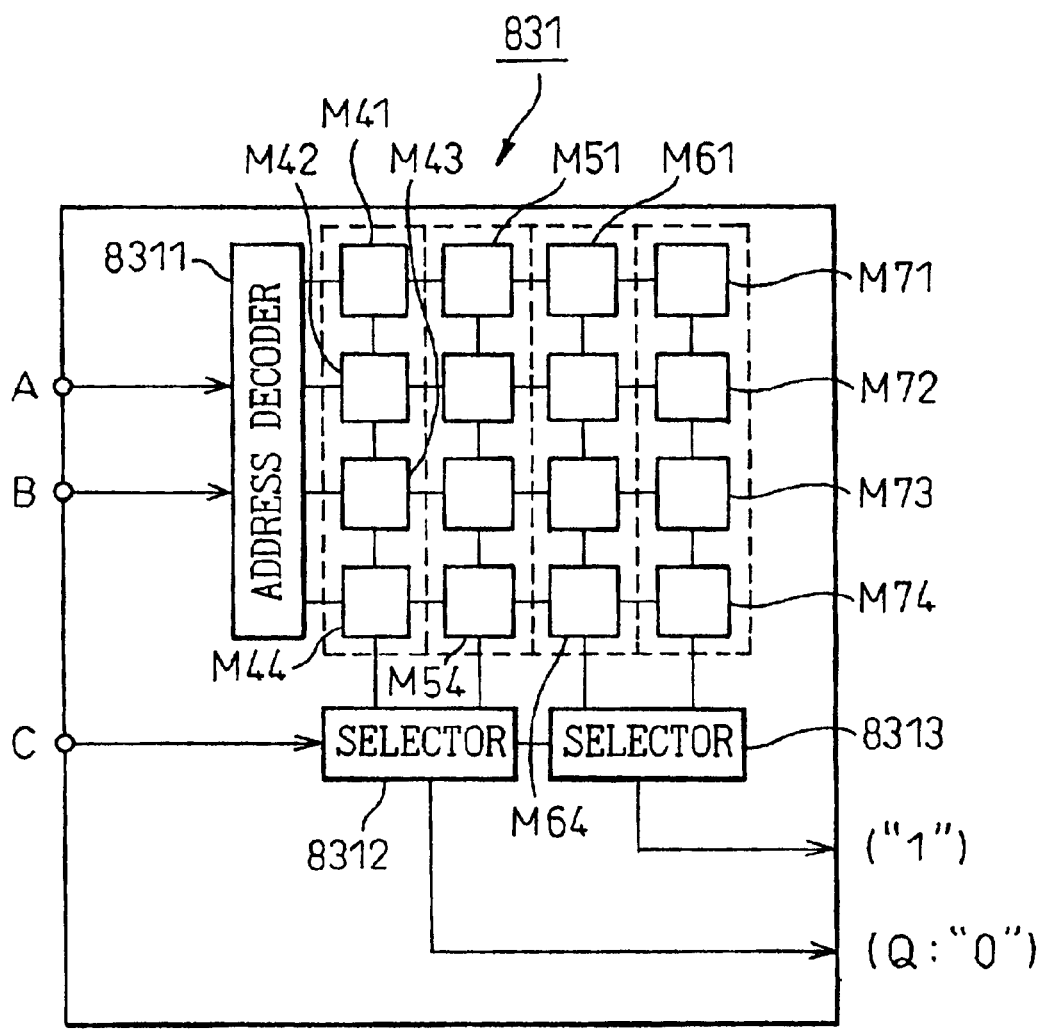
FIG. 10 is a is a block diagram showing an example of 3-input 2-output LUT unit in the 6-input 3-output LUT of FIG. 9.

FIG. 10 is a block diagram showing an example of 3-input 2-output LUT units in the 6-input 3-output LUT shown in FIG. 9. All of the 3-input 2-output LUT units 831~834 have the identical configuration.

The LUT unit 831 shown in FIG. 10 is comprised of an address decoder 8311, selectors 8312, 8313, and four sets of 4 bit memory unit group M41~M44, M51~M54, M61~M64, M71~M74. The address decoder 8311 decodes 2 bit input signal A, B to designate each one for the four sets of memory unit group M41~M44, M51~M54, M61~M64, M71~M74, and by the input signal C, selects and outputs the data of one of the two sets of memory unit group M41~M44 or M51~M54 (output signal Q: the signal supplied to the input "0" of the selector 826), and data of one of the two sets of memory unit group M61~M64 or M71~M74 (the signal supplied to the input "1" of the selector 826).

Figure 11:
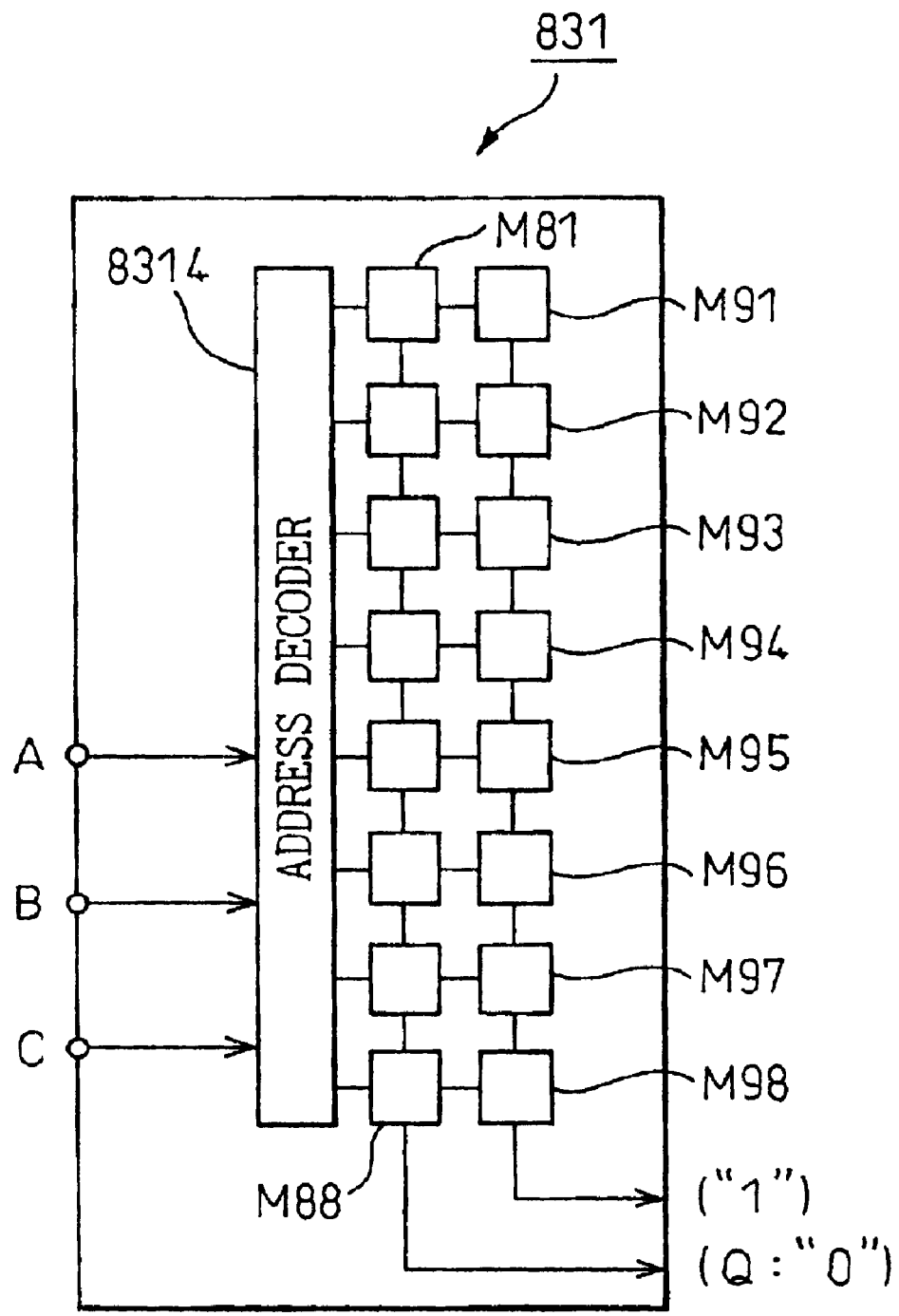
FIG. 11 is a block diagram showing another example of 3-input 2-output LUT unit in the 6-input 3-output LUT of FIG. 9.

FIG. 11 is a block diagram showing another example of 3-input 2-output LUT units in the 6-input 3-output LUT shown in FIG. 9.

The LUT unit 831 shown in FIG. 11 is comprised of an address decoder 8314, and two sets of 8 bit memory unit group M81~M88 and M91~M98. The address decoder 8314 decodes 3 bit input signal A, B, C to designate each one for the two sets of memory unit group M81~M88 and M91~M98, and outputs respective data (output signal Q: signal supplied to the input "0", and signal supplied to the input "1").

Figure 12:
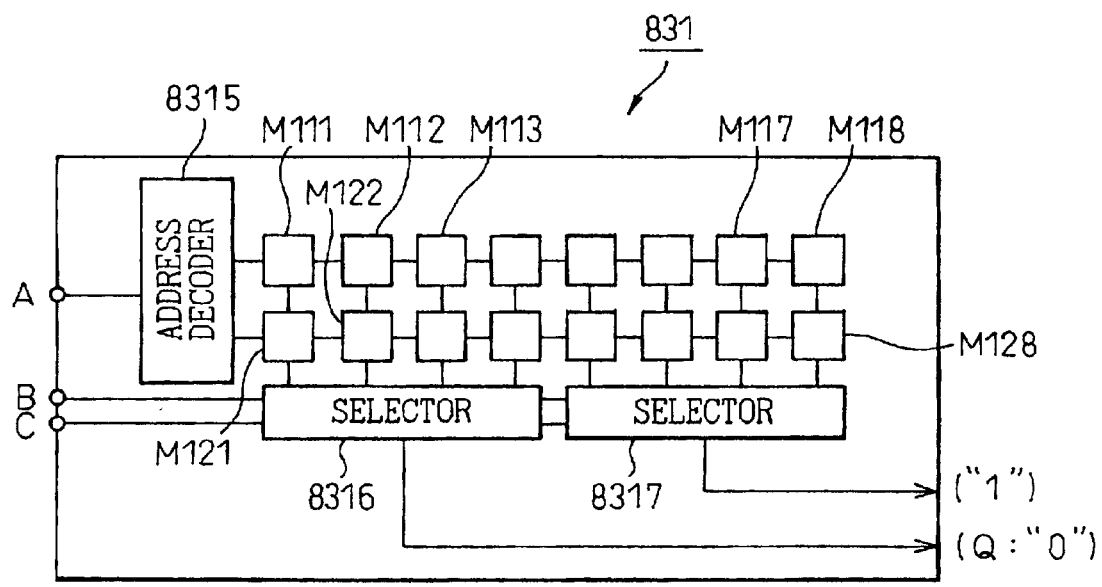
FIG. 12 is a block diagram showing still another example of 3-input 2-output LUT unit in the 6-input 3-output LUT of FIG. 9.

FIG. 12 is a block diagram showing still another example of 3-input 2-output LUT units in the 6-input 3-output LUT shown in FIG. 9.

The LUT unit 831 shown in FIG. 12 is comprised of an address decoder 8315, selectors 8316, 8317, and eight sets of 2 bit memory unit group M111, M121; M112, M122; ...; M118, M128. The address decoder 8315 decodes 1 bit input signal A to designate each one for the eight sets of memory unit group M111, M121~M118, M128, and by 2 bit input signal B, C, selects and outputs the data of one set of the memory unit group M111, M121~M114, M124 (output signal Q: the signal supplied to the input "0" of the selector 826), and the data of one set of the memory unit group M115, M125~M118, M128 (signal supplied to the input "1" of the selector 826).

Figure 13:
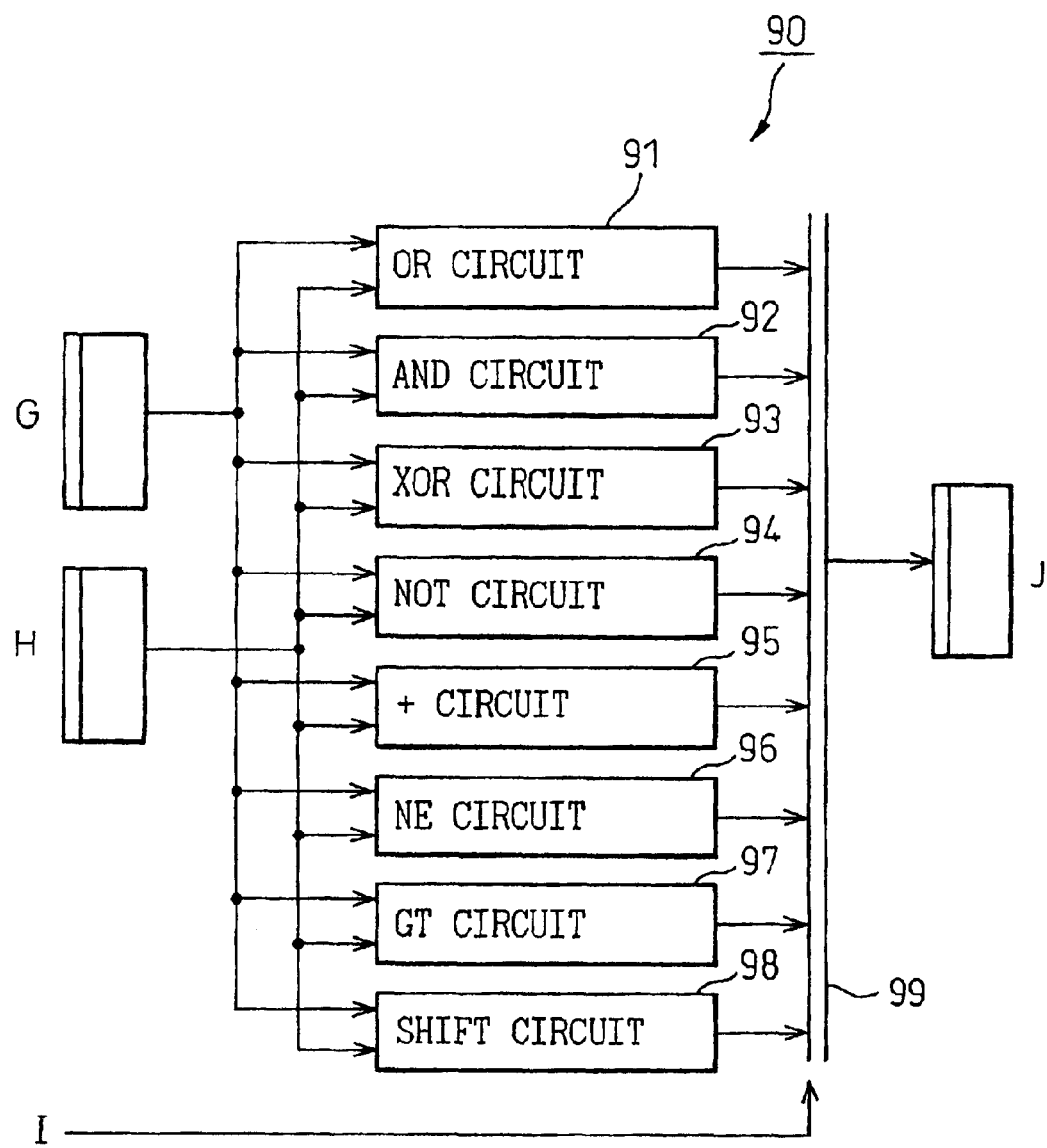
FIG. 13 is a block diagram showing an example of configuration of a 8 operation ALU circuit (ALU 16)

FIG. 13 is a block diagram showing an exemplary configuration of an ALU circuit (ALU 16) 90 of 8 operations. In FIG. 13, reference symbols G and H denote 16 bit data, I denotes command signal that determines the operation, and J denotes output signal.

AS shown in FIG. 13, the ALU circuit 90 is comprised of eight operation circuits consisting of OR circuit 91, AND circuit 92, XOR circuit 93, not circuit 94, +(addition) circuit 95, NE (Not Equal) circuit 96, GT (Greater Than) circuit 97 and SHIFT circuit 98 having 16 bit data G and H input therein, respectively, and a selector 99 for selecting the output from the eight operation circuits 91 to 98 in accordance with the command signal I, and outputs the output signal J portion corresponding to the command signal I.

Cases where the ALU circuit (ALU 16) 90 shown in FIG. 13 is implemented with 3-input 1-output LUT to 7-input 1-output LUT as used in conventional FPGA (horizontal axis: 3 LUT—7 LUT) is compared with cases where it is implemented with the 6-input 3-output LUT as shown in FIG. 6 (configuration comprising eight 3-input 1-output LUT 731~738, a mode changing memory 71 and selectors 721~726: 3 LUT*8) and with the 6-input 3-output LUT as shown in FIG. 9 (configuration comprising four 3-input 2-output LUT 831~834, a mode changing memory 81 and selectors 821~826: 4 LUT*4) as used in the FPGA according to the present invention, are compared in the following FIGS. 14 and 15. The ALU 16 is equipped with, for example, a data selector for switching wire connection (a circuit which does not require LUT), a random logic (a circuit composed of LUT) and a flip-flop (a circuit for fixed portion of logic block). It is to be understood that the comparison in FIGS. 14 and 15 is performed assuming that conditions other than the configuration of LUT are substantially the same.

Figure 14:
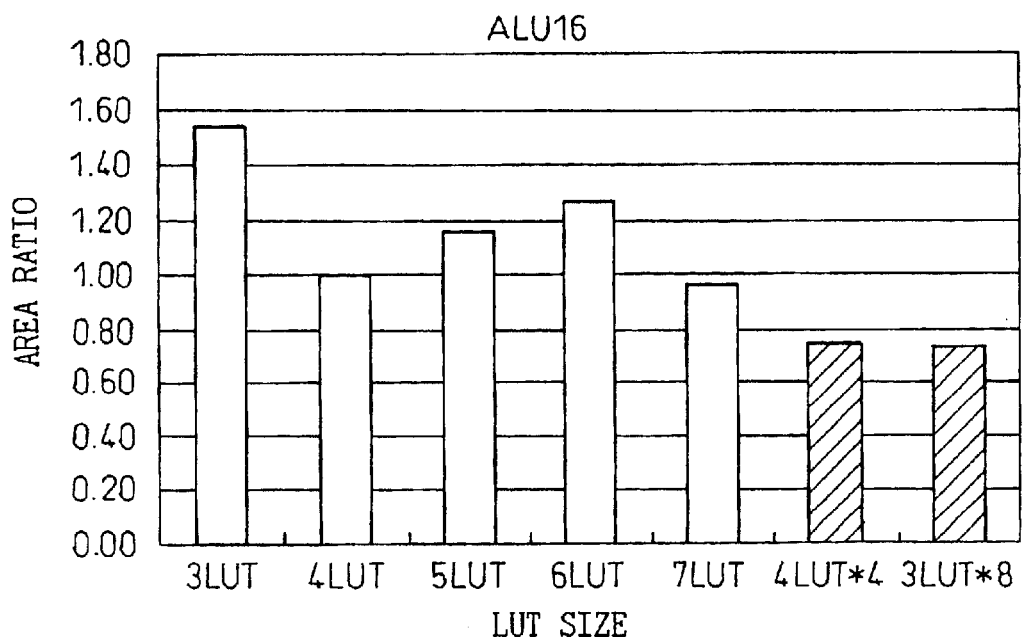
FIG. 14 is a view showing difference of the area ratio for ALU 16 shown in FIG. 13 when implemented with LUT in conventional FPGA compared to LUT in FPGA according to the present invention.
Figure 15:
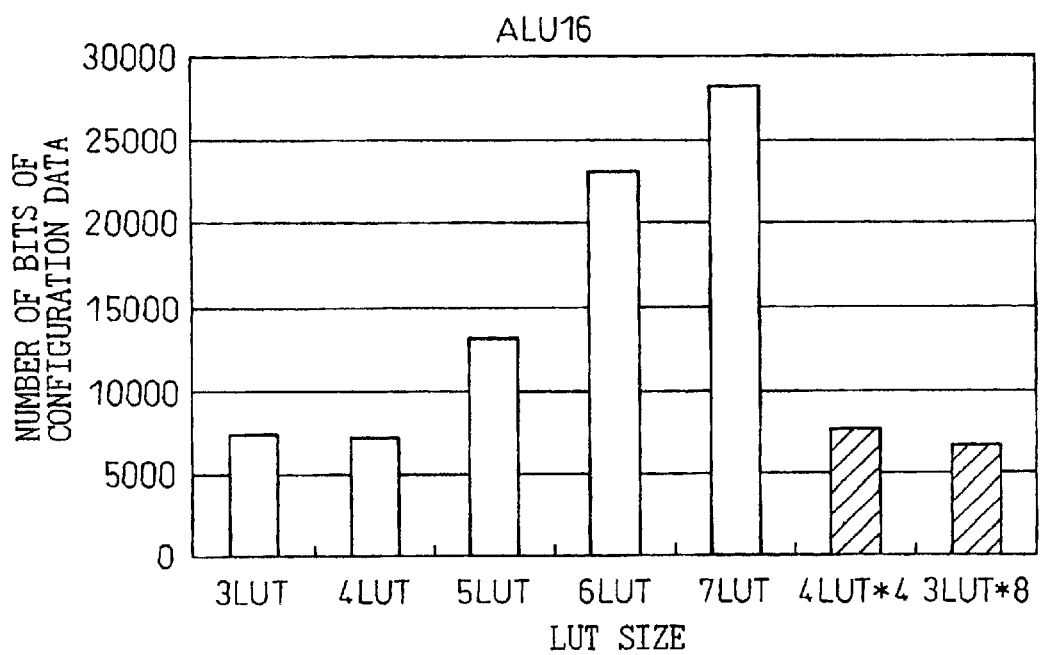
FIG. 15 is a view showing difference of the number of bits of configuration data for ALU 16 shown in FIG. 13 when implemented with LUT in conventional FPGA compared to LUT in FPGA according to the present invention.

FIG. 14 is a view showing the difference of the area ratio when the ALU 16 as shown in FIG. 13 is implemented with LUT used in conventional FPGA and in FPGA according to the present invention (3 LUT~7 LUT and 6-input 3-output LUT (3 LUT*8 and 4 LUT*4)). FIG. 15 is a view showing the difference of number of bits of configuration data when the ALU 16 as shown in FIG. 13 is implemented with LUT used in conventional FPGA and in FPGA according to the present invention. Vertical axis in FIG. 14 represents the area when the ALU 16 is configured using various LUTs, expressed as area ratio assuming the area of the case when configured with commonly used 4-input 1-output LUT (4

LUT) to be equal to 1. Vertical axis in FIG. 15 represents the number of bits of configuration data when the ALU 16 is configured using various LUTs.

As can be seen from FIG. 14, when the ALU 16 as shown in FIG. 13 is implemented with the 6-input 3-output LUT used in FPGA according to the present invention (3 LUT*8 and 4 LUT*4), for example, the area ratio is greatly reduced compared to the case where the same ALU 16 is implemented with LUT used in conventional FPGA (3 LUT-7 LUT). More specifically, it can be seen that the case of 3 LUT*8 where the 6-input 3-output LUT is implemented as 3-input 1-output LUT×8 planes gives an area about 75% of that for the case where 4-input 1-output LUT (4 LUT) is used to implement the ALU 16 and gives the smallest area in conventional LUTs.

Further, as can be seen from FIG. 15, the number of bits of configuration data for the case where the ALU 16 is implemented with the 6-input 3-output LUT used in FPGA according to the present invention (3 LUT*8 and 4 LUT*4) is comparable to that for the case of 4 LUT that gives the smallest value among the conventional cases. Thus, although the 6-input 3-output LUT of the present invention requires 4 times as much configuration data as, for example, 4-input 1-output LUT, the number of bits of the configuration data can be made comparable. This is due to the fact that the conventional LUT constructs the selectors in output stage with LUTs while the present invention achieves it by switching of routing wires so that number of LUTs used can be reduced.

In the above description, the 6-input 3-output LUT used in the FPGA according to the present invention is only an example, and the present invention can be equally applied to M-input N-output (e.g., 8-input 4-output) LUT. Further, it is to be understood that configuration of the 6-input 3-output LUT itself, for example, is not limited to the eight 3-input 1-output LUT units shown in FIG. 6, or to the four 3-input 2-output LUT units shown in FIG. 9, and various modification is possible within the scope of the invention.

As has been described above in detail, according to the present invention, the circuit area of a look up table (LUT) or a programmable logic circuit device can be reduced. Further, according to the present invention, the power consumption of a programmable logic circuit device can also be reduced.

Many different embodiments of the present invention may be constructed without departing from the spirit and scope of the present invention, and it should be understood that the present invention is not limited to the specific embodiments described in this specification, except as defined in the appended claims.

What is claimed is:

1. A look up table of M inputs and N outputs, comprising: a plurality of LUT units; and
an internal configuration control circuit controlling an internal configuration of said plurality of LUT units, wherein said internal configuration control circuit comprises
a plurality of selectors selecting I/O signals of said plurality of LUT units, and
a selector control circuit having a memory, controlling said plurality of selectors in accordance with data stored in said memory, and defining the internal configuration of said plurality of LUT units.

2. The look up table as claimed in claim 1, wherein said plurality of selectors include:
an input signal selector provided at an input of at least one of said LUT units to select an input signal; and
an output signal selector provided at an output of said LUT units selecting an output signal, said input signal selector and said output signal selector being controlled in accordance with the data stored in said memory.

3. The look up table as claimed in claim 1, wherein said plurality of selectors include:
an input signal selector provided at an input of at least one of said LUT units to select an input signal; and
an output signal selector provided at an output of said LUT units selecting an output signal, said input signal selector and said output signal selector being controlled in accordance with the input signal.

4. The look up table as claimed in claim 1, wherein said look up table of M inputs and N outputs is a 6-input 3-output look up table.

5. The look up table as claimed in claim 4, wherein said 6-input 3-output look up table comprises eight 3-input 1-output LUT units.

6. The look up table as claimed in claim 4, wherein said 6-input 3-output look up table comprises four 3-input 2-output LUT units.

7. A programmable logic circuit device comprising: a plurality of logic blocks;
a plurality of routing wires connected to each of said logic blocks;
a plurality of switch circuits provided at an intersection of each of said routing wires;
a plurality of connection blocks provided between an I/O line of each of said logic blocks and each of said routing wires; and
an I/O block performing an input/output operation with external equipment, wherein each of said logic blocks has a look up table of M inputs and N outputs, comprising:
a plurality of LUT units; and
an internal configuration control circuit controlling an internal configuration of said plurality of LUT units, wherein said internal configuration control circuit comprises
a plurality of selectors selecting I/O signals of said plurality of LUT units, and
a selector control circuit having a memory, controlling said plurality of selectors in accordance with data stored in said memory, and defining the internal configuration of said plurality of LUT units.

8. The programmable logic circuit device as claimed in claim 7, wherein said plurality of selectors include:
an input signal selector provided at an input of at least one of said LUT units to select an input signal; and
an output signal selector provided at an output of said LUT units selecting an output signal, said input signal selector and said output signal selector
being controlled in accordance with the data stored in said memory.

9. The programmable logic circuit device as claimed in claim 7, wherein said plurality of selectors include:
an input signal selector provided at an input of at least one of said LUT units to select an input signal; and
an output signal selector provided at an output of said LUT units selecting an output signal, said input signal selector and said output signal selector being controlled in accordance with the input signal.

10. The programmable logic circuit device as claimed in claim 7, wherein said look up table of M inputs and N outputs is a 6-input 3-output look up table.

11. The programmable logic circuit device as claimed in claim 10, wherein said 6-input 3-output look up table comprises eight 3-input 1-output LUT units.

12. The programmable logic circuit device as claimed in claim 10, wherein said 6-input 3-output look up table comprises four 3-input 2-output LUT units.

13. A method of configuring a look up table of M inputs and N outputs, comprising:

providing a plurality of LUT units; and selectively controlling I/O signals of said plurality of LUT units to set a predetermined mode of an internal configuration.

14. The method of configuring a look up table as claimed in claim 13, wherein the I/O signals of said plurality of LUT units are selectively controlled in accordance with data stored in the corresponding look up table.

15. The method of configuring a look up table as claimed in claim 13, wherein an input signal input to at least one of said LUT units and an output signal output from said LUT unit are selectively controlled in accordance with data stored in the corresponding look up table.

16. The method of configuring a look up table as claimed in claim 13, wherein an input signal input to at least one of said LUT units and an output signal output from said LUT unit are selectively controlled in accordance with a predetermined function of the input signal.

* * * * *

UNITED STATES PATENT AND TRADEMARK OFFICE
CERTIFICATE OF CORRECTION

PATENT NO. : 6,812,737 B2
DATED : November 2, 2004
INVENTOR(S) : Toshinori Sueyoshi et al.

It is certified that error appears in the above-identified patent and that said Letters Patent is hereby corrected as shown below:

Column 12,
Lines 6 and 11, change "unit" to -- units --

Signed and Sealed this

Twenty-sixth Day of April, 2005

JON W. DUDAS
*Director of the United States Patent and Trademark Office*